(12) United States Patent
Kwon

(10) Patent No.: US 7,015,884 B2
(45) Date of Patent: Mar. 21, 2006

(54) ORGANIC ELECTROLUMINESCENT DISPLAY, DRIVING METHOD AND PIXEL CIRCUIT THEREOF

(75) Inventor: Oh-Kyong Kwon, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 133 days.

(21) Appl. No.: 10/005,152

(22) Filed: Dec. 7, 2001

(65) Prior Publication Data

US 2002/0118150 A1   Aug. 29, 2002

(30) Foreign Application Priority Data

Dec. 29, 2000   (KR) ................ 2000-85683

(51) Int. Cl.
G09G 3/30   (2006.01)

(52) U.S. Cl. .......................... 345/78; 345/76
(58) Field of Classification Search ............ 345/76–84
See application file for complete search history.

(56) References Cited

U.S. PATENT DOCUMENTS

| 6,091,203 A | 7/2000 | Kawashima et al. ..... 315/169.3 |
| 6,229,508 B1 * | 5/2001 | Kane .......................... 345/82 |
| 6,246,180 B1 | 6/2001 | Nishigaki ................. 315/169.3 |
| 6,580,408 B1 * | 6/2003 | Bae et al. ..................... 345/76 |

FOREIGN PATENT DOCUMENTS

| DE | 10028598 A1 | 3/2001 |
| JP | 2000221942 | 8/2000 |
| JP | 2000347621 | 12/2000 |
| WO | WO 99/65012 | 12/1999 |

OTHER PUBLICATIONS 36.4L: Late-News Paper: 4.0-in. TFT-OLED Displays and a Novel Digital Driving Method, Kazutaka Inukai, Hajime Kimura, Mayumi Mizukami, Junya Maruyama, Satoshi Murakami, Jun Koyama, Toshimitsu Konuma, and Shumpei Yamazaki, Semiconductor Energy Laboratory Col., Ltd., Atsugi, Kanagawa, Japan, dated May 16, 2000.

* cited by examiner

Primary Examiner—Regina Liang
Assistant Examiner—Duc Q Dinh
(74) Attorney, Agent, or Firm—H.C. Park & Associates, PLC

(57) ABSTRACT

Disclosed is an OELD and a pixel circuit which comprise: an organic EL element for emitting light corresponding to a supplied current; a first switch for switching data voltage supplied to a data line in response to a select signal supplied to a scan line; a first TFT for supplying the current to the organic EL element in response to the data voltage supplied to a gate of the first TFT via the first switch; a second TFT having a gate coupled to the gate of the first TFT and compensating for a deviation of a threshold voltage of the first TFT; and a capacitor for maintaining the data voltage supplied to the gate of the first TFT during a predetermined time.

31 Claims, 13 Drawing Sheets

ORGANIC ELECTROLUMINESCENT DISPLAY, DRIVING METHOD AND PIXEL CIRCUIT THEREOF

BACKGROUND OF THE INVENTION (a) Field of the Invention

The present invention relates to an organic electroluminescent (EL) display, a driving method of the EL display and a pixel circuit of the EL display. More specifically, the present invention relates to an organic EL display (OELD), its driving methods and a pixel circuit that can compensate for deviation of the threshold voltage of a thin film transistor (TFT) and achieve high gray scale display when driving the pixels of the OELD by using the TFT.

(b) Description of the Related Art

In general, the OELD electrically excites fluorescent organic compounds to emit light, and performs voltage driving or current driving on a (N×M) number of organic luminescent cells so as to display images. As shown in FIG. 1, the organic luminescent cell comprises an anode (ITO), an organic thin film, and a cathode layer (Metal). The organic thin film comprises multi-layers including an emitting layer (EML), an electron transport layer (ETL), and a hole transport layer (HTL) so as to provide a good balance between the electron concentration and the hole concentration thereby improving emitting efficiency, and it additionally comprises an electron injecting layer (EIL) and a hole injecting layer (HIL).

Methods for driving the organic luminescent cells as described above are categorized as a passive matrix method and an active matrix method. The passive matrix method forms positive electrodes to be perpendicular to negative electrodes and selects lines and drives them, and the active matrix method connects the TFT and a capacitor to each ITO pixel electrode so that the voltage may be maintained according to capacitance.

FIG. 2 shows a conventional pixel circuit for driving an OELD using a TFT, illustrating a pixel from among a (N×M) number of the pixels. Referring to FIG. 2, a current driving transistor (Mb) is coupled to the OELD and supplies current to emit light. The current through the current driving transistor (Mb) is controlled by the data voltage supplied via a switching transistor (Ma). In this instance, a capacitor C for maintaining the supplied voltage during a predetermined frame period is coupled between the source and the gate of the current driving transistor (Mb). The gate of the switching transistor (Ma) responds to an n-th select signal line Select [n], and the source to a data line Data[m].

Referring to FIG. 3, as to an operation of the pixel having the above-described configuration, when the transistor Ma is turned on by the select signal Select[n] supplied to the gate of the switching transistor Ma, the data voltage $V_{DATA}$ is supplied to the gate (node A) of the transistor Mb via a data line. In response to the data voltage $V_{DATA}$ supplied to the gate, the current flows to the OELD via the transistor Mb to emit light.

In this instance, the current that flows to the OELD is expressed as follows:

$$I_{OELD} = \frac{\beta}{2} \cdot (V_{GS} - V_{TH})^2 = \frac{\beta}{2} \cdot (V_{DD} - V_{DATA} - V_{TH})^2 \quad \text{Equation 1}$$

where $I_{OELD}$ represents the current flowing to the OELD, $V_{GS}$ represents the voltage between the source and the gate of the transistor Mb, $V_{TH}$ represents the threshold voltage of the transistor Mb, $V_{DATA}$ represents the data voltage, and $\beta$ represents a constant.

As expressed in Equation 1 and according to the pixel circuit as shown in FIG. 2, the current corresponding to the supplied data voltage $V_{DATA}$ is supplied to the OELD, and in response to the supplied current, the OELD emits light. In this instance, the data voltage $V_{DATA}$ has multi-step values within a predetermined range so as to show the gray.

However, it is difficult for the conventional pixel circuit to achieve high gray scale because the threshold voltage $V_{TH}$ of the TFT varies depending on the manufacturing process thereof. For example, in the case of driving the TFT pixels with data voltage in the range of 3 volts, two data voltages representing adjacent gray levels must be apart from each other approximately by 12 mV(=3V/256) so as to implement 8-bit (256) gray scale. If the deviation of threshold voltage is less than 100 mV, it is difficult to discriminate one data voltage from another which results in decreased gray scale.

SUMMARY OF THE INVENTION

It is an object of the present invention to provide an OELD for compensating for deviations of the threshold voltage of the TFT and displaying high gray scale.

An OELD according to one aspect of the present invention comprises: a plurality of data lines for transmitting data voltages for displaying image signals; a plurality of scan lines for transmitting select signals; and a plurality of pixel circuits respectively formed on a plurality of pixels defined by the data lines and the scan lines, individual pixel circuits comprising: an organic EL element for emitting light corresponding to a supplied current; a first switch for switching data voltage supplied to a data line in response to a select signal supplied to a scan line; a first TFT for supplying the current to the organic EL element in response to the data voltage supplied to a gate of the first TFT via the first switch; a second TFT having a gate coupled to the gate of the first TFT and compensating for a threshold voltage deviation of the first TFT; and a capacitor for maintaining the data voltage supplied to the gate of the first TFT during a predetermined time.

A method according to one aspect of the present invention is to drive an OELD including a plurality of data lines, a plurality of scan lines crossing the data lines, and a plurality of matrix type pixels having TFTs formed in regions defined by the data lines and the scan lines and supplying current to organic EL elements, the method for driving an OELD comprises the steps of: supplying a data voltage for displaying image signals to the data lines; sequentially supplying a select signal for selecting a pixel row to the scan lines; switching the data voltage supplied to the data lines in response to the select signal, and compensating the supplied data voltage to reduce the effect of threshold voltage deviation of the TFT; and transmitting the compensated data voltage to a gate of the TFT and supplying the current to the organic EL element.

Furthermore, the method may further comprise the step of initializing the data voltage supplied to the gate of the TFT in response to a control signal.

An OELD pixel circuit according to one aspect of the present invention is formed on a plurality of pixels defined by a plurality of data lines and scan lines, the OELD pixel circuit comprises: an organic electroluminescent (EL) element; a first thin film transistor (TFT) having a drain coupled to the organic EL element; a second TFT having a gate coupled to a gate of the first TFT, and the gate and a drain of the second TFT being coupled together; a first switch having a control terminal coupled to the scan line, and having a first terminal and a second terminal respectively coupled to the data line and a source of the second TFT; and a capacitor coupled between the gate and a source of the first TFT.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by illustrating of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Figure 4:
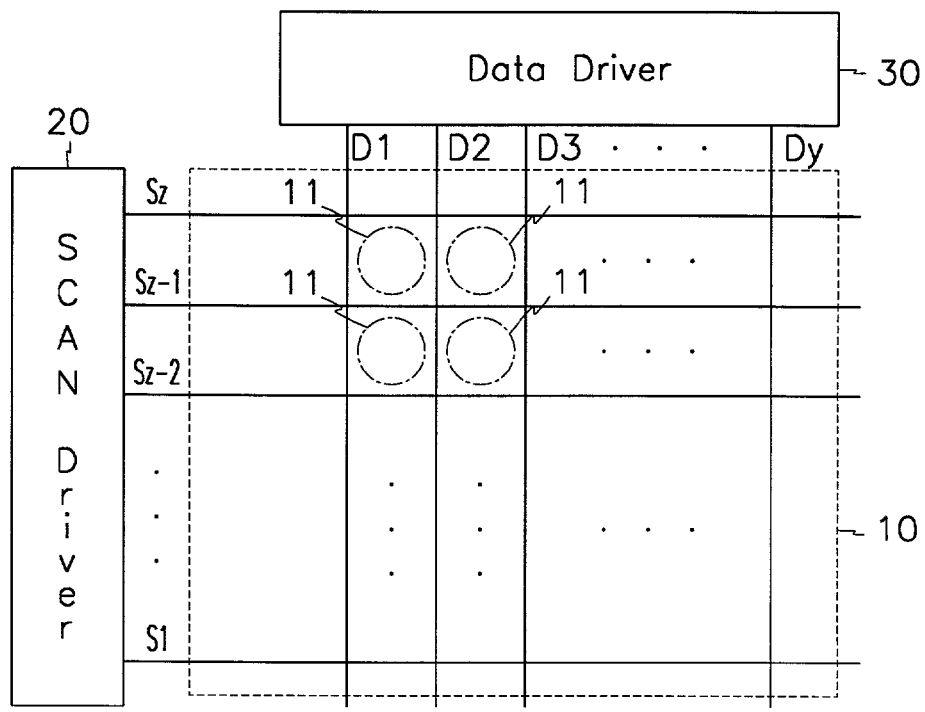
FIG. 4 shows an OELD device according to a preferred embodiment of the present invention.

FIG. 4 shows an OELD according to a preferred embodiment of the present invention.

As shown, the OELD comprises an OELD panel 10; a data driver 30; and a scanning driver 20.

The OELD panel 10 comprises a plurality of data lines D1 through Dy for transmitting data voltages for displaying image signals; scan lines S1 through Sz for transmitting select signals; and a pixel circuit 11 formed on each of a plurality of pixels surrounded by the data lines and the scan lines.

The data driver 30 supplies the data voltage for displaying the image signals to the data lines, and the scanning driver 20 sequentially supplies the select signals to the scan lines.

Figure 5:
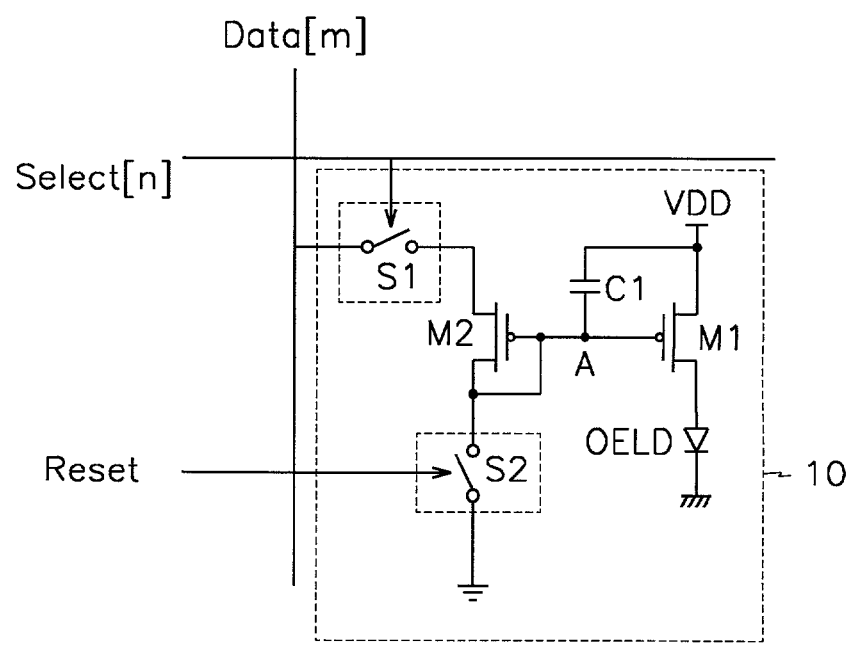
FIG. 5 shows a pixel circuit according to a preferred embodiment of the present invention.

FIG. 5 shows the pixel circuit 11 according to the preferred embodiment of the present invention.

As shown, the pixel circuit 11 comprises an OELD, TFTs M1 and M2, switches S1 and S2, and a capacitor C1.

The OELD emits light corresponding to the supplied current, and the current driving transistor M1 has a source coupled to the power voltage VDD and a drain coupled to the OELD, and supplies the current corresponding to the data voltage which is provided to a gate of the transistor M1 via the data line, to the OELD.

The transistor M2 has a gate coupled to the gate of the transistor M1, and the gate and a drain of the transistor M2 are coupled to function as a diode, and the transistor M2 compensates for deviations of the threshold voltage of the transistor M1 for supplying the current. According to the pixel circuit shown in FIG. 5, the current supply transistor M1 and the threshold voltage compensation transistor M2 are configured in PMOS type TFTs, but can also be configured in NMOS type TFTs as described subsequently.

The capacitor C1, coupled between the power voltage VDD and the gate of the transistor M1, maintains the data voltage supplied to the gate of the transistor M1 during a predetermined frame period.

The switch S1 is switched in response to the select signal Select[n] supplied by the scan line, and transmits the data voltage supplied to the data line to the current driving transistor M1 via the transistor M2. The switch S2 initializes the gate voltage of the transistor M1 in response to a reset signal.

An operation of the pixel circuit according to the preferred embodiment as shown in FIG. 5 will now be described.

When the switch S1 is turned on according to the select signal Select[n] supplied to the switch S1, the data voltage $V_{DATA}$ supplied to the data line is supplied to the gate (node A) of the driving transistor M1 via the transistor M2, and in response to the data voltage $V_{DATA}$ supplied to the gate, the current flows to the OELD via the transistor M1 to emit light.

In this instance, the current flowing to the OELD is expressed as follows:

$$I_{OELD} = \frac{\beta}{2} \cdot (V_{GS} - V_{TH1})^2 = \frac{\beta}{2} \cdot (V_{DD} - (V_{DATA} - V_{TH2}) - V_{TH1})^2 \quad \text{Equation 2}$$

where $I_{OELD}$ represents the current flowing to the OELD, $V_{GS}$ represents the voltage between the source and the gate of the transistor M1, $V_{TH1}$ represents the threshold voltage of the transistor M1, $V_{TH2}$ represents the threshold voltage of the transistor M2, and β represents a constant.

In this instance, if the threshold voltages of the transistors M1 and M2 are identical, that is, $V_{TH1}=V_{TH2}$, Equation 2 can be expressed in Equation 3. According to the preferred embodiment of the present invention, since the transistors M1 and M2 are manufactured under almost identical process conditions, the deviation of the threshold voltages of the two transistors are minimal, and accordingly, the threshold voltages become virtually identical.

$$I_{OELD} = \frac{\beta}{2} \cdot (V_{DD} - V_{DATA})^2 \qquad \text{Equation 3}$$

Therefore, according to the preferred embodiment of the present invention, the OELD as expressed by Equation 3 flows the current corresponding to the data voltage supplied to the data line regardless of the threshold voltage in the current driving transistor M1. That is, since the transistor M2 compensates for the deviation of the threshold voltage in the current driving transistor M1, the transistor M1 can precisely control the current flowing to the OELD. Accordingly, the OELD with high gray scale is provided.

When the data during a previous time frame period is a high level voltage and the data of a subsequent frame period is a low level voltage, no more data signal can be supplied to the node A because of diode connection characteristics of the transistor M2. Therefore, the switch S2 may be provided to initialize the node A for each frame period with a predetermined level (e.g., a ground level). In this instance, the switch S2 can be driven by an additional reset signal or by a just previous select signal Select[n-1] to increase an aperture ratio of pixels of the OELD.

Figure 6:
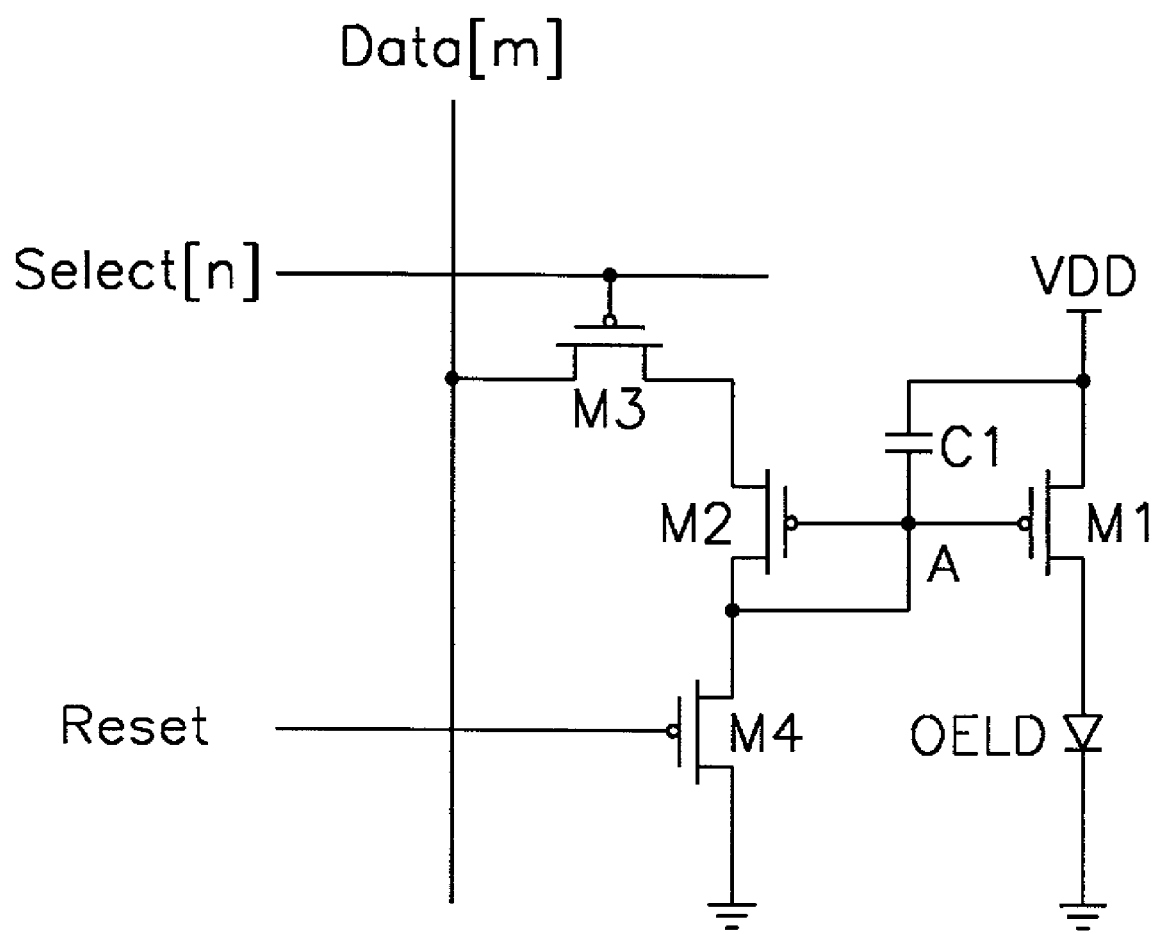
FIG. 6 shows a pixel circuit according to a first preferred embodiment of the present invention.

FIG. 6 shows a pixel circuit of the OELD according to a first preferred embodiment of the present invention. As shown, the pixel circuit comprises a current supplying transistor M1 and a threshold voltage compensation transistor M2 of PMOS transistors, and switches S1 and S2 of PMOS transistors M3 and M4, like of the pixel circuit of FIG. 5.

Also, an additional reset signal Reset is supplied to a gate of the transistor M4 for resetting the gate voltage of the transistor M1.

Figure 8A:
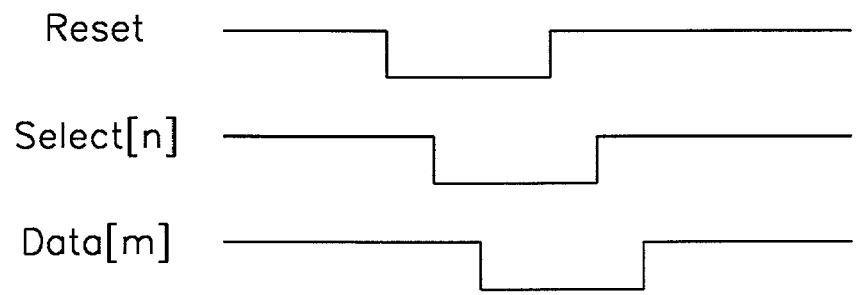
FIGS. 8A and 8B show timing diagrams for the pixel circuit as shown in FIG. 6.
Figure 8B:
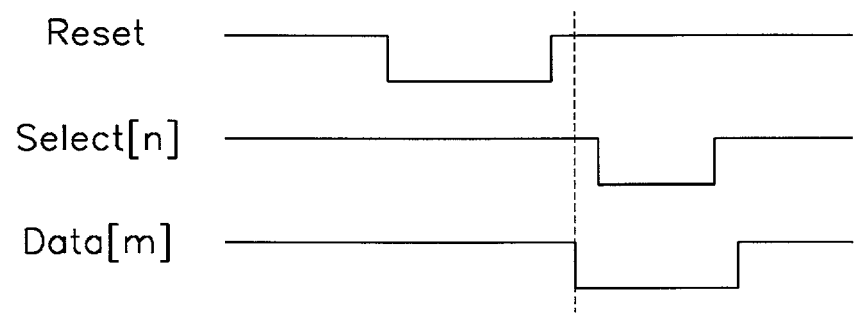

FIGS. 8A and 8B show timing diagrams for driving the pixel circuit of FIG. 6.

Referring to FIG. 8A, the node A is initialized by the initial reset signal, a corresponding pixel is selected via the select signal Select[n], and the data signal Data[m] is supplied to the corresponding pixel. That is, according to the driving method shown in FIG. 8A, signals are supplied to the respective transistors in the order of the reset signal, the select signal and the data signal.

In detail, an external reset signal Reset is supplied to the gate of the transistor M4 to initialize the node A into a ground level, and a select signal Select[n] is supplied to the gate of the transistor M3 to activate the corresponding pixel. A data signal Data[m] is supplied to the source of the activated transistor M3 to drive the current driving transistor M1. In this instance, the current that flows to the OELD via the current driving transistor M1 is expressed in Equation 3.

The pixel circuit for using the external reset signal according to the first preferred embodiment of the present invention can be driven using the timing diagram of FIG. 8B as well as that of FIG. 8A.

Referring to FIG. 8B, the node A is initialized by the initial reset signal Reset, the data signal Data[m] is supplied to the data line, and the corresponding pixel is selected via the select signal Select[n]. That is, according to the driving method shown in FIG. 8B, signals are supplied to the respective transistors in the order of the reset signal, the data signal and the select signal.

Figure 7:
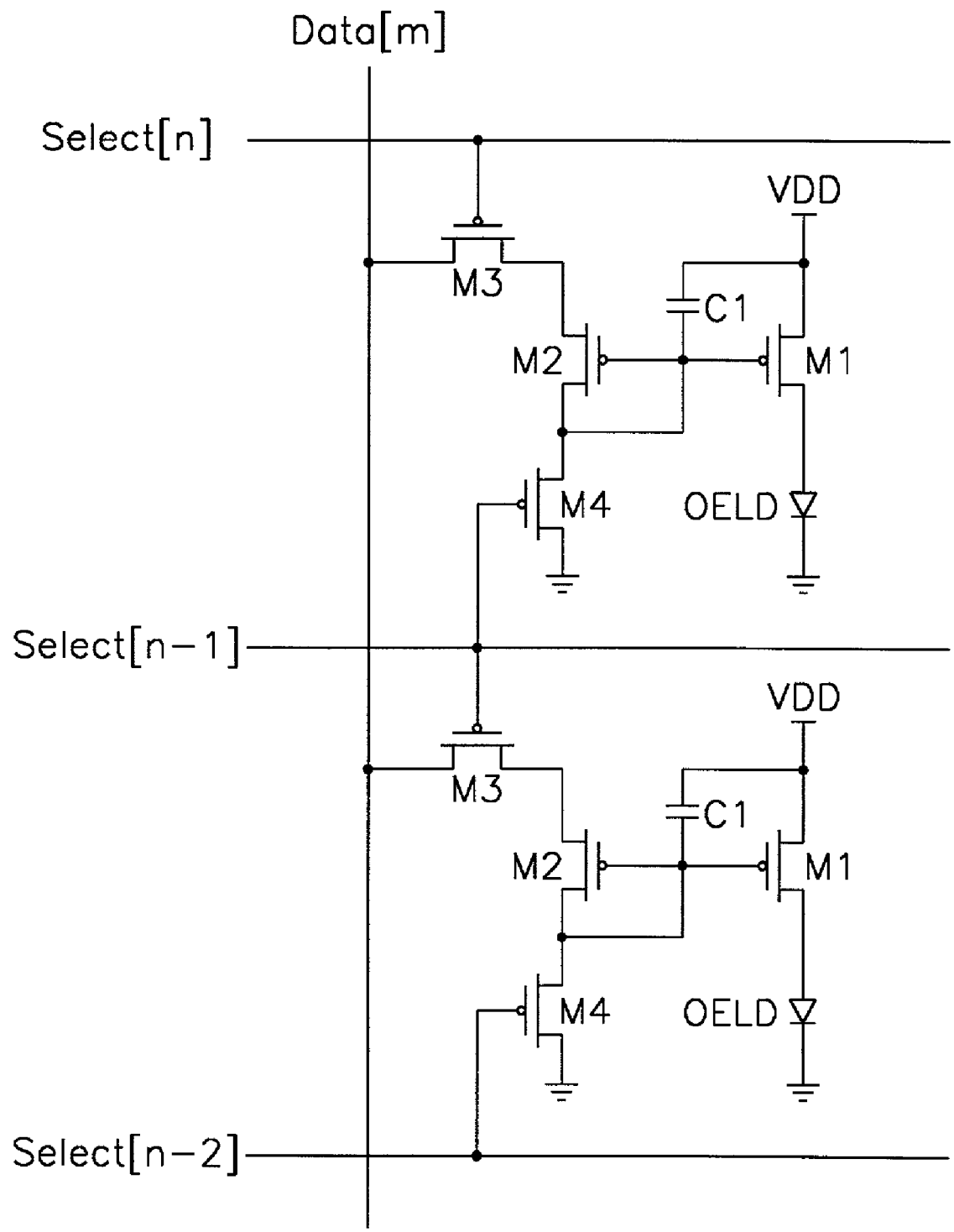
FIG. 7 shows a pixel circuit according to a second preferred embodiment of the present invention.

FIG. 7 shows a pixel circuit of the OELD according to a second preferred embodiment of the present invention. The pixel circuit according to the second preferred embodiment is almost identical to the pixel circuit of FIG. 6 except that the gate of the transistor M4 is coupled to a previous scan line. That is, the pixel circuit according to the second preferred embodiment uses the select signal Select[n-1] of the previous scan line instead of an additional external reset signal Reset, and supplies the select signal Select[n-1] to the gate of the transistor M4.

As described above, when the additional external reset signal is not used, no additional wiring for transmitting the reset signal is needed. Accordingly, the aperture ratio of the pixel can be increased.

Figure 9:
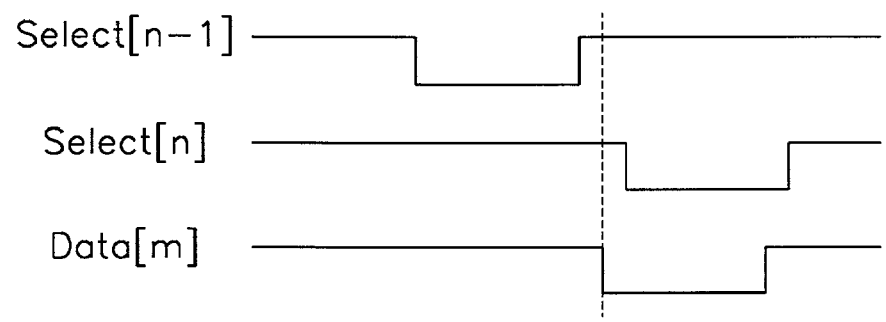
FIG. 9 shows a timing diagram for the pixel circuit as shown in FIG. 7.

FIG. 9 shows a timing diagram for driving the OELD according to the second preferred embodiment.

As shown, according to the second preferred embodiment for resetting the node A using the scanning signal, the signals must be supplied to the respective transistors in the order of the previous select signal (reset signal), the data signal and the present select signal. That is, the data voltage must be supplied to the data line before the present select signal Select[n] is supplied to the scan line.

In the case the select signal Select[n] is supplied before the present data voltage is supplied as shown in FIG. 8A, the previous data voltage supplied to the data line is supplied to the current driving transistor M1 via the transistor M3. Therefore, the select signal must be supplied to the data line after the present data voltage is supplied to the data line.

Figure 10:
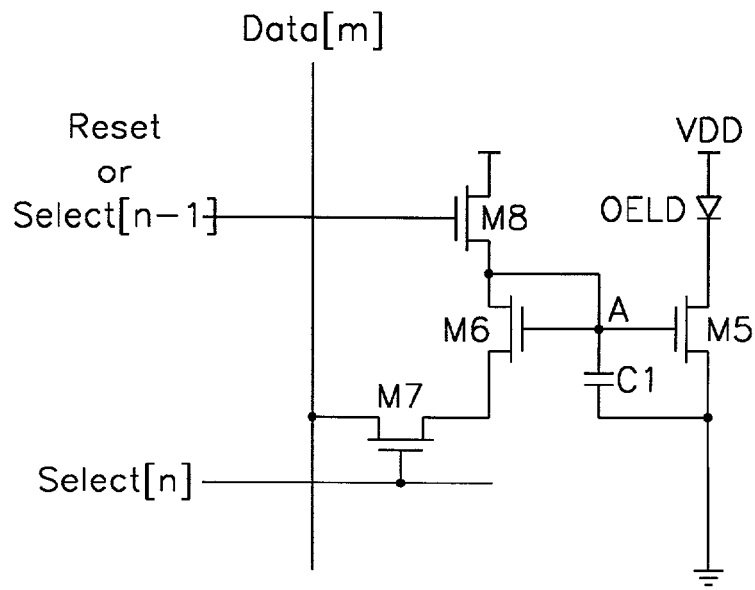
FIG. 10 shows a pixel circuit according to a third preferred embodiment of the present invention.
Figure 11A:
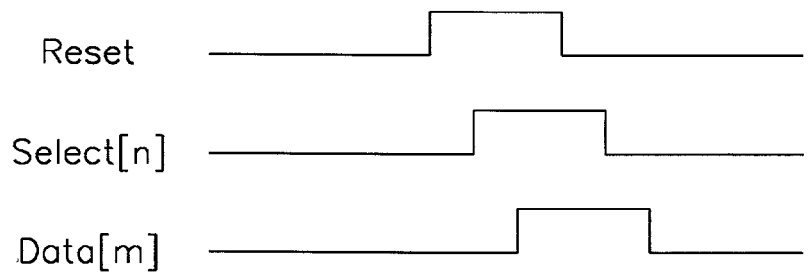
FIGS. 11A and 11B show timing diagrams for the pixel circuit as shown in FIG. 10.
Figure 11B:
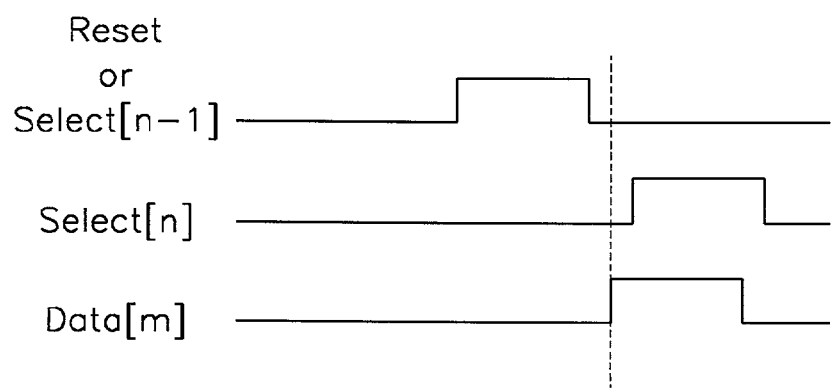

FIG. 10 shows a pixel circuit of the OELD according to a third preferred embodiment of the present invention, and FIGS. 11A and 11B show timing diagrams for driving the pixel circuit of FIG. 10. As shown in FIG. 10, the pixel circuit according to the third preferred embodiment of the present invention comprises NMOS type transistors M5, M6, M7 and M8 differing from the pixel circuits of FIGS. 6 and 7 and having a configuration totally symmetrical with the pixel circuits of FIGS. 6 and 7.

Since an operation of the pixel circuit of FIG. 10 and the timing diagrams of FIGS. 11A and 11B can be easily understood by a skilled person according to the descriptions of FIGS. 6 and 7, a repeated description will not be provided.

Figure 12:
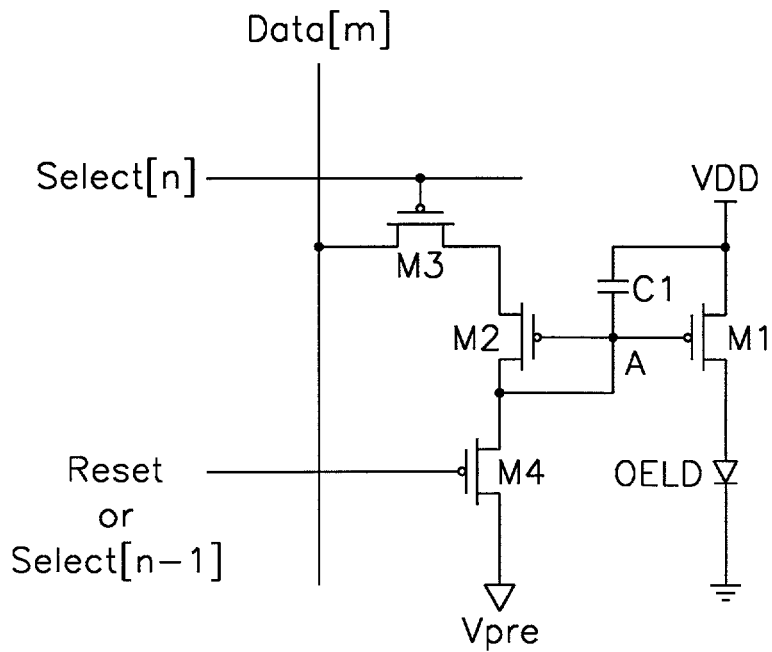
FIG. 12 shows a pixel circuit according to a fourth preferred embodiment of the present invention.

FIG. 12 shows a pixel circuit of the OELD according to a fourth preferred embodiment of the present invention.

As shown, the pixel circuit according to the fourth preferred embodiment has a configuration almost identical to those of the pixel circuits of FIGS. 6 and 7 except that a pre-charge voltage Vpre instead of the ground voltage is supplied to the drain of the switching transistor M4. As described above, when the pre-charge voltage is supplied to the drain of the transistor M4, the initial voltage of the node A can be increased to the pre-charge voltage level Vpre instead of the ground level, and hence, switching time of the transistor and power consumption can be reduced. In this instance, it is preferable to establish the pre-charge voltage to be slightly less than the minimum voltage supplied to the node A that corresponds to the minimum voltage supplied to the data line and the maximum gray level (i.e., white level).

Figure 13:
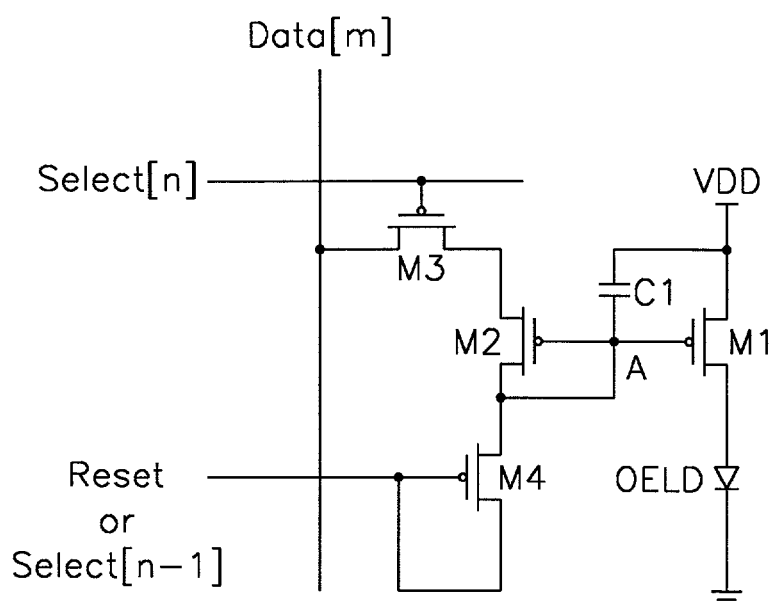
FIG. 13 shows a pixel circuit according to a fifth preferred embodiment of the present invention.

FIG. 13 shows a pixel circuit of OELD according to a fifth preferred embodiment of the present invention.

As shown, the pixel circuit according to the fifth preferred embodiment has a configuration almost identical to those of the pixel circuits of FIGS. 6 and 7 except that the drain and the gate of the switching transistor M4 are coupled to function as a diode and the gate of the transistor M4 (i.e., an input terminal of the diode) is coupled to an external reset signal terminal or a previous scan line.

As shown, according to the preferred embodiment, the node A can also be initialized via the transistor M4 coupled to the diode, and when the reset signal or the previous select signal is used instead of the ground voltage or the pre-charge voltage, since additional ground wiring or pre-charge wiring is not needed to be formed, the amount of wiring is reduced and the aperture ratio is increased.

Figure 14:
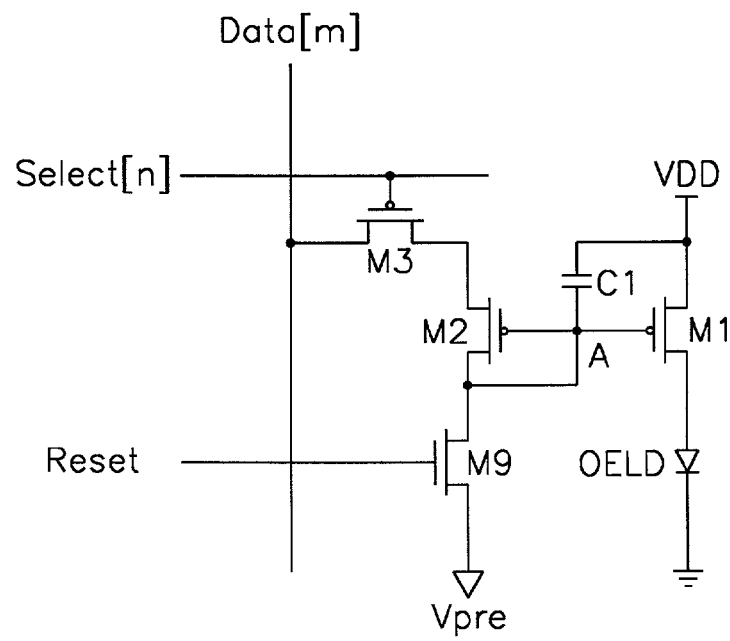
FIG. 14 shows a pixel circuit according to a sixth preferred embodiment of the present invention.

FIG. 14 shows a pixel circuit of the OELD according to a sixth preferred embodiment of the present invention.

As shown, the pixel circuit according to the sixth preferred embodiment has a configuration almost identical to that of the pixel circuit of FIG. 6 except that the NMOS transistor M9 is used instead of the PMOS transistor M4. An external reset signal is supplied to the gate of the transistor M9.

Referring to FIG. 6, when the switching transistor M4 receiving the reset signal is a PMOS transistor, a predetermined voltage (e.g., the ground level) is supplied to the gate of the transistor M4 at a reset operation, and the voltage at the source (node A) of the transistor M4 continues to be decreased because of the reset operation. Therefore, the voltage $V_{GS}$ between the gate and the source of the transistor M4 continues to be decreased and the current flowing to the ground or the pre-charge voltage from the node A via the transistor M4 continues to be reduced and substantial reset time is required. Also, since the voltage difference between the gate and the source of the transistor M4 must be greater than the absolute value of the threshold voltage Vth, when it is assumed that the reset signal supplied at the reset operation is the ground voltage, the actual lowest voltage at the node A becomes |Vth|.

Unlike this, the pixel circuit according to the sixth preferred embodiment uses an NMOS transistor for the switching transistor M9. Thus, the lowest voltage at the node A that can be achieved is almost the ground level. This widens the range of the data voltage to display gray levels can be widened. Also, since the voltage $V_{GS}$ between the gate and the source of the transistor M9 is constant differing from FIG. 6, the current flowing to the ground or the pre-charge voltage from the node A via the transistor M4 is constant, and accordingly, the reset operation can be quickly performed.

Figure 16:
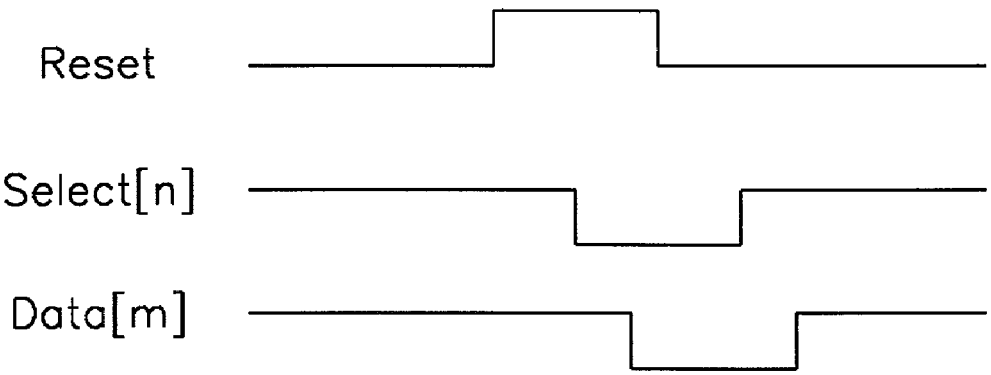
FIGS. 16 and 17 show timing diagrams for the pixel circuit as shown in FIGS. 14 and 15.

FIG. 16 shows a timing diagram for driving the pixel circuit according to the sixth preferred embodiment. As shown, since the transistor M9 having the gate to which the reset signal is supplied is an NMOS transistor in the pixel circuit according to the sixth preferred embodiment, the reset signal has a waveform opposite to that of the reset signal of FIG. 8A.

Since the operation of the pixel circuit of FIG. 14 and the timing diagram of FIG. 16 can be easily understood by a skilled person, a repeated description will not be provided.

Figure 15:
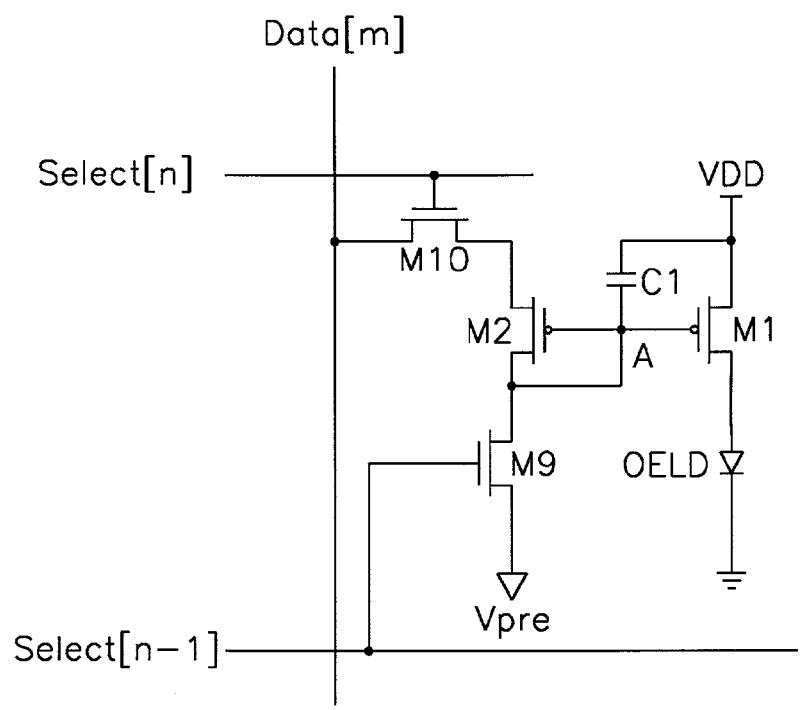
FIG. 15 shows a pixel circuit according to a seventh preferred embodiment of the present invention.
Figure 17:
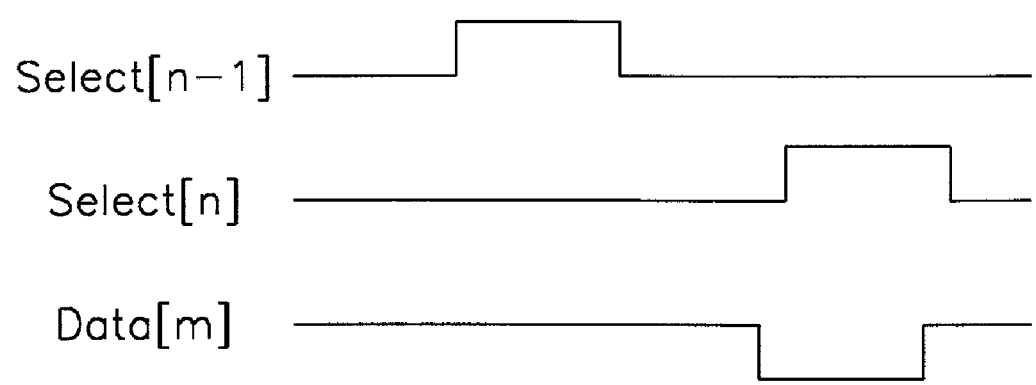

FIG. 15 shows a pixel circuit of the OELD according to a seventh preferred embodiment of the present invention, and FIG. 17 shows a timing diagram of a driving waveform used in FIG. 15.

As shown by FIG. 15, the pixel circuit according to a seventh preferred embodiment has a configuration almost identical to that of the pixel circuit of FIG. 14 except that the previous scan line is coupled to the gate of the NMOS transistor M9, the previous select signal Select[n-1] is used as a reset signal, and the transistor M10 having the gate coupled to the scan line is an NMOS transistor.

When the previous select signal coupled to the gate of the NMOS transistor M9 is used as a reset signal, the transistor for switching the data voltage must be an NMOS transistor.

As shown by FIG. 17, since the pixel circuit according to the seventh preferred embodiment resets the node A using a previous select signal, the signals must be supplied to the respective transistor in the order of the previous select signal (reset signal), the data signal and the present select signal.

Figure 18:
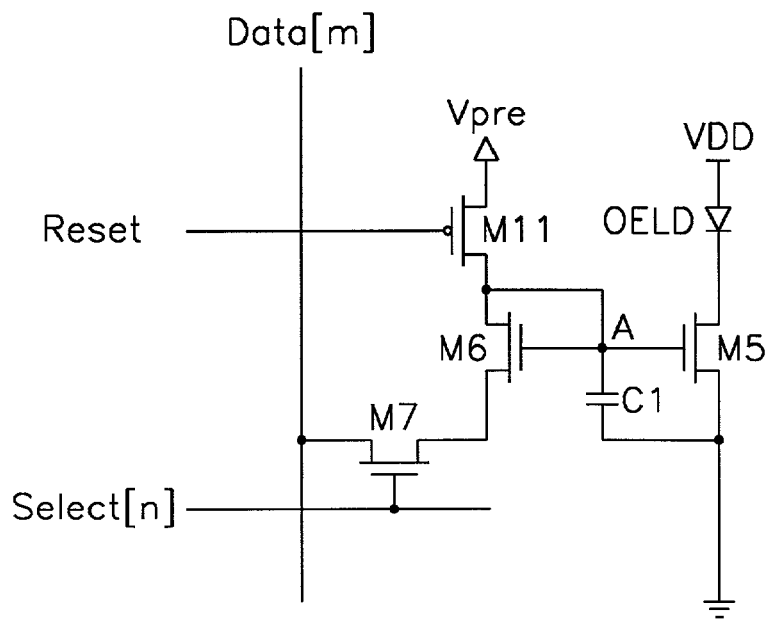
FIG. 18 shows a pixel circuit according to an eighth preferred embodiment of the present invention.
Figure 19:
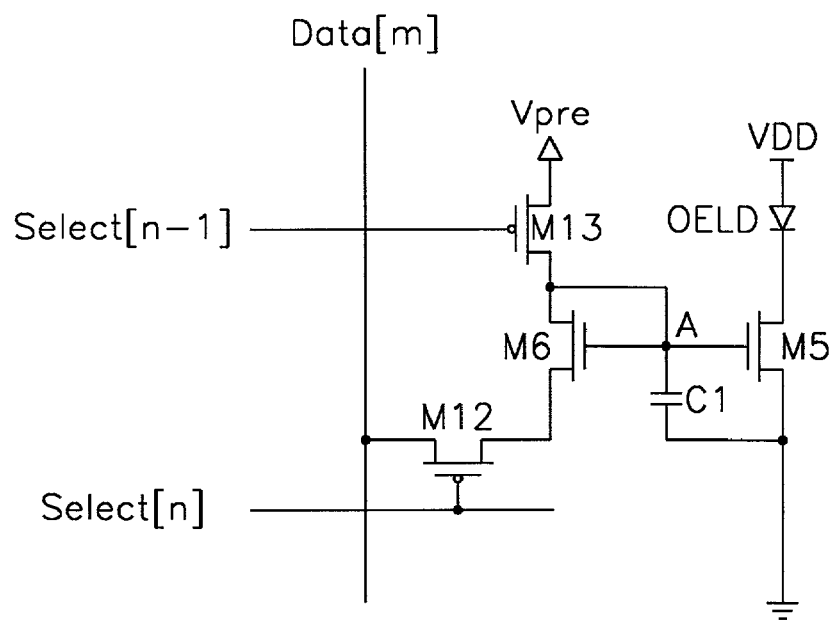
FIG. 19 shows a pixel circuit according to a ninth preferred embodiment of the present invention.

FIGS. 18 and 19 respectively show pixel circuits of the OELD according to eighth and ninth preferred embodiments of the present invention.

The PMOS transistors and the NMOS transistors of the respective pixel circuits of FIGS. 18 and 19 are symmetrically changed with those of the pixel circuits of FIGS. 14 and 15.

Since the operation of the pixel circuits in FIGS. 18 and 19 can be easily understood by a skilled person according to the above description, a repeated description will not be provided.

A layout and a cross sectional view of the OELD according to the preferred embodiment of the present invention will now be described.

Figure 20:
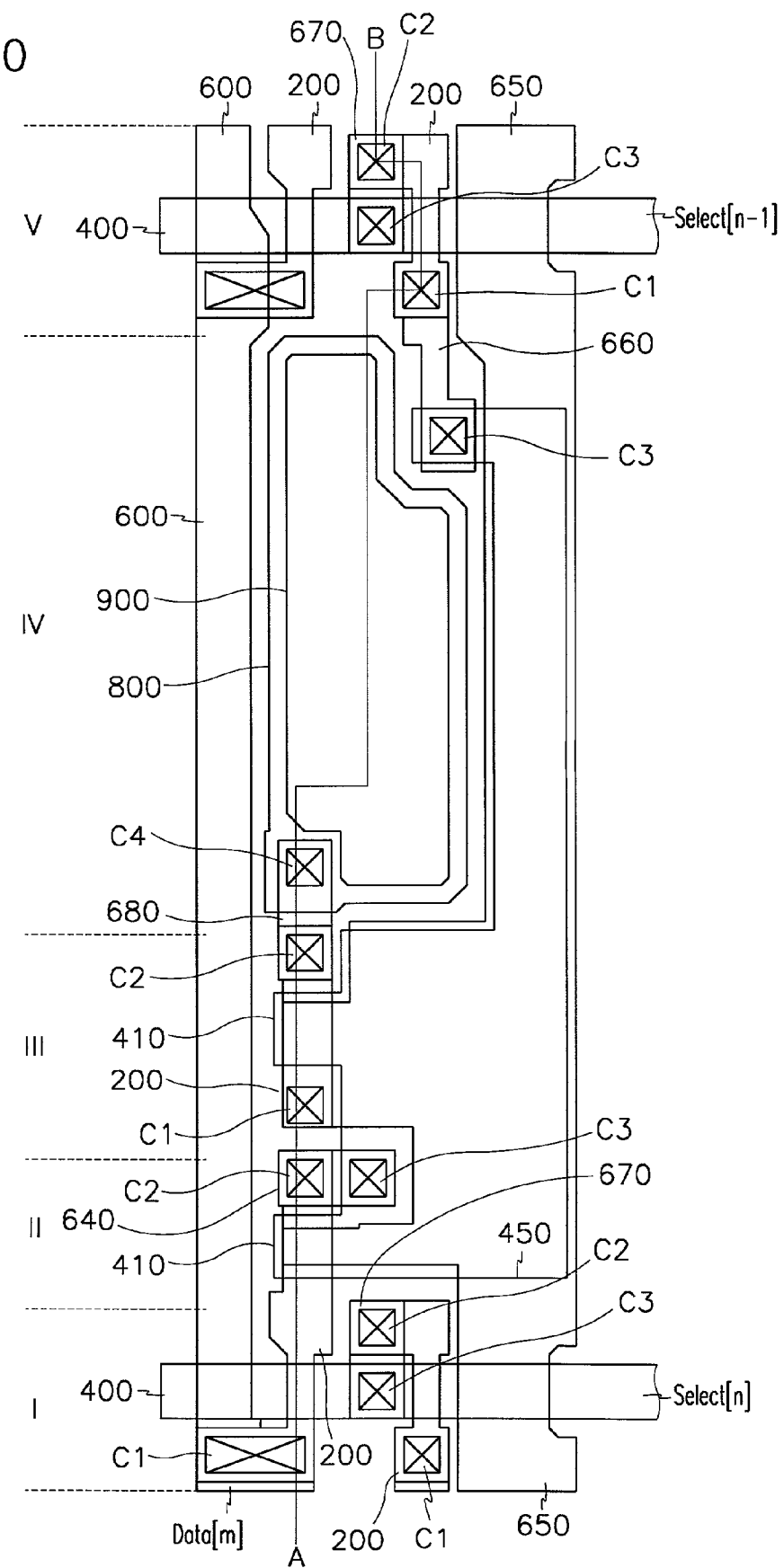
FIG. 20 shows a layout of an organic EL element according to the preferred embodiment of the present invention.

FIG. 20 shows a layout of the OELD, and more precisely, a layout of the pixel circuit of FIG. 13.

Figure 21:
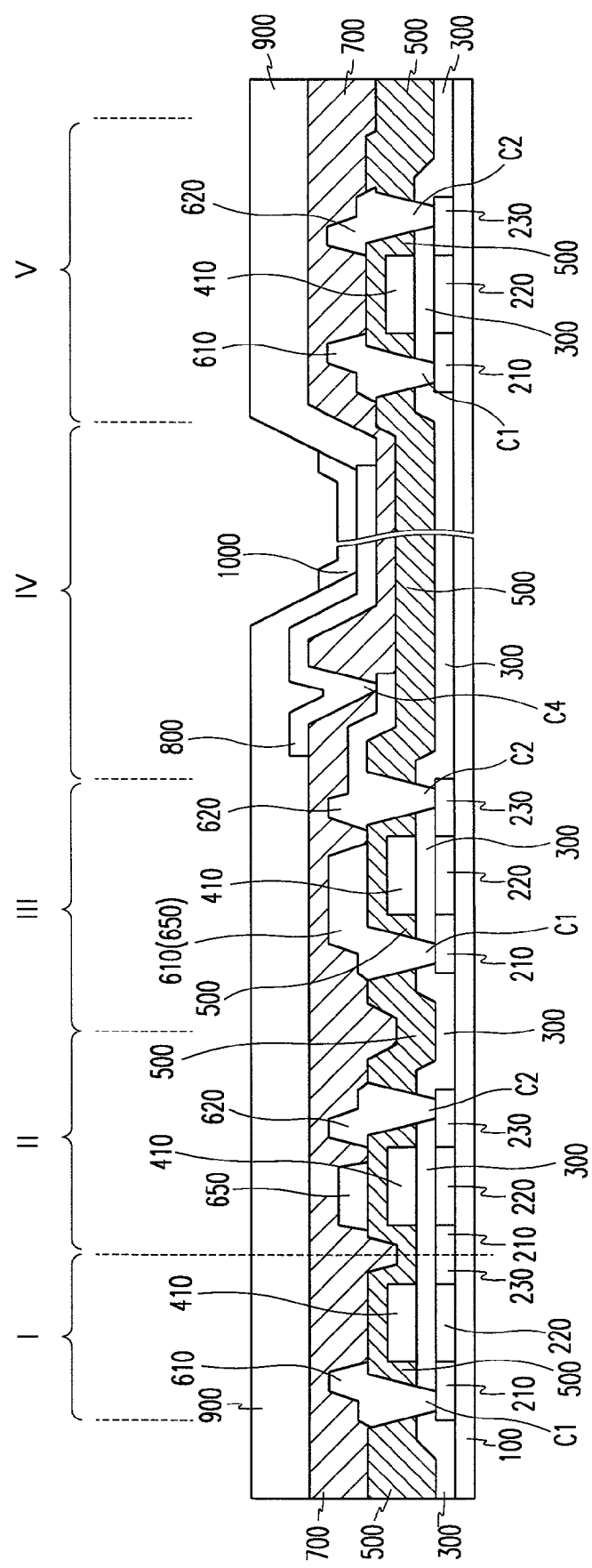
FIG. 21 shows a cross sectional view of FIG. 20 with respect to a line A–B.

FIG. 21 shows a cross sectional view of FIG. 20 with respect to the line A–B.

Referring to FIGS. 20 and 21, the regions I, II, III and V respectively define the regions for forming the TFTs M3, M2, M1 and M4 thereon, and the region IV for forming the OELD thereon.

As shown in FIGS. 20 and 21, a polycrystalline silicon (poly-Si) layer 200 is formed on a transparent insulation substrate 100, and a gate insulation layer 300 of $SiO_2$ or SiNx is formed thereon.

A scan line 400 of Al and Cr is patterned in the horizontal direction on the gate insulation layer 300 to be crossed with the polycrystalline silicon layer 200. Gate electrodes 410 are respectively formed on portions where the scan lines 400 are superimposed with the polycrystalline silicon layer 200 in the I and V regions. Also, a first capacitor electrode 450 is patterned on the same layer with the same material as the scan line 400. The gate electrodes 410 are respectively formed on the portions where the first capacitor electrode 450 is superimposed with the polycrystal silicon layer 200 of the II and III regions.

In this instance, a portion of the polycrystalline silicon layer 200 under the gate electrode 410 is not doped and forms a channel region 220. Both outer sides of the channel region 220 in polycrystalline silicon layer 200 are doped with p-type dopant and respectively form a drain region 230 and a source region 210.

An insulating interlayer layer 500 of silicon dioxide or silicon nitride is formed on the top of the gate layer such as the scan line 400 or the first capacitor electrode 450, and the gate insulation layer 300 and the interlayer layer 500 have contact holes C1 and C2 to expose the source and drain regions 210 and 230.

A data line 600 of Cr or Mo is formed in the perpendicular direction on the interlayer layer 500. A portion extended from the data line 600 and superimposed with a portion of the silicon layer 200 of the region I, that is, the source region 210, becomes a source electrode 610. In this instance, the source electrode 610 is connected to the source region 210 via the contact hole C1 formed on the interlayer layer 500.

Also, a second capacitor electrode 650 superimposed on the first capacitive line 450, for forming capacitance, is formed on a layer identical with that of the data line 600 and with a material identical with that of the data line 600. A portion where the second capacitor electrode 650 is superimposed with a portion of the silicon layer 200 of the region III, that is, the source region 210, becomes the source electrode 610. In this instance, the source electrode 610 is connected to the source region 210 via the contact hole C1.

First through fourth signal lines 640, 660, 670 and 680 are formed on the same layer with the same material as the data line 600. A portion where the first signal line 640 is superimposed with a portion of the polycrystalline silicon layer 200 of the region II, that is, the drain region 230, becomes the drain electrode 620, and a portion where the second signal line 660 is superimposed with the source region 210 of the region V becomes the source electrode 610. A portion where the third signal line 670 is superimposed with the drain region 230 of the region V becomes the drain electrode 620, and a portion where the fourth signal line 680 is superimposed with the drain region 230 of the region III becomes the drain electrode 620. In this instance, the source and drain electrodes 610 and 620 are respectively connected to the source and drain regions 210 and 230 via the contact holes C1 and C2.

Figure 1:
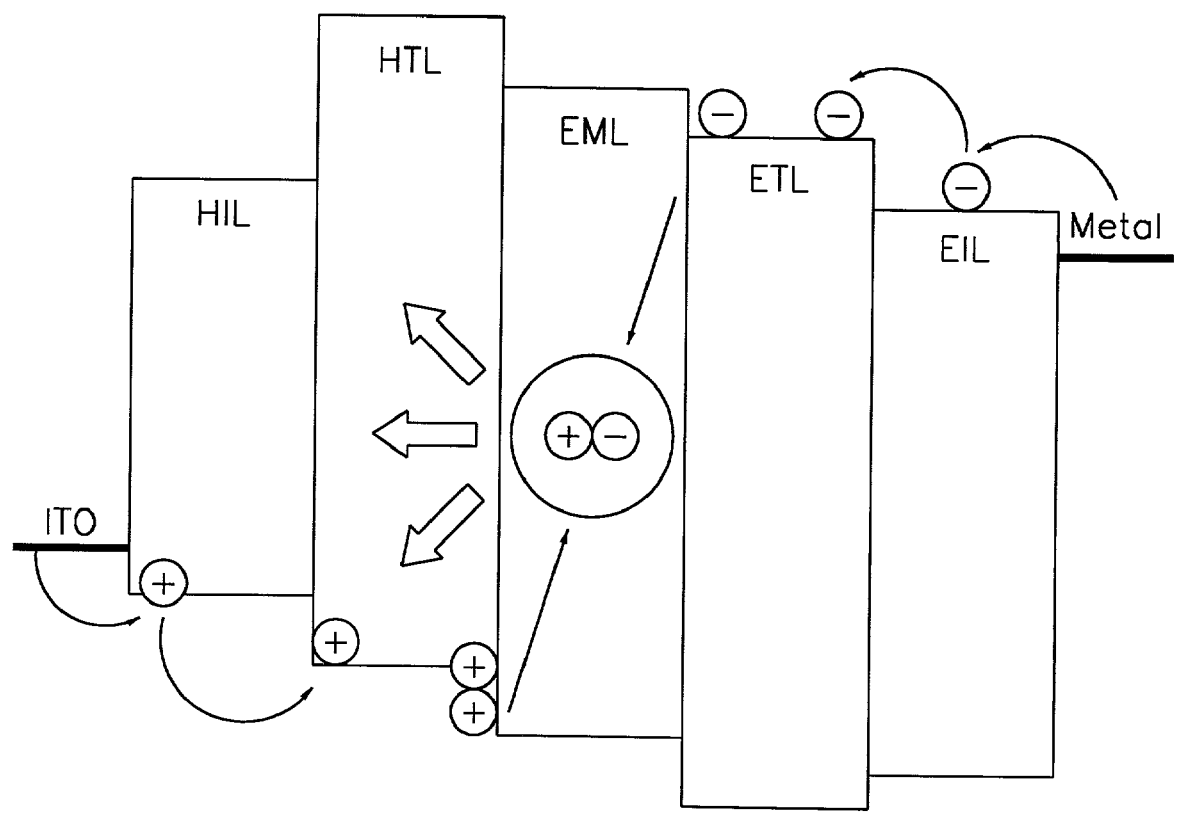
FIG. 1 shows a diagram of a general organic EL element.
Figure 2:
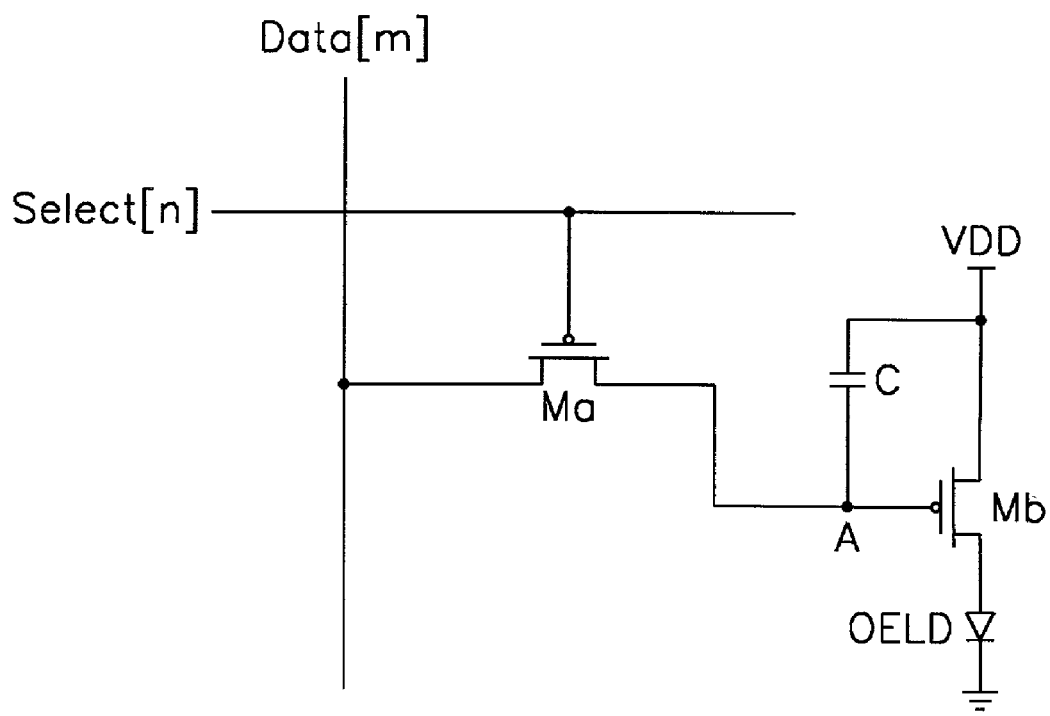
FIG. 2 shows a conventional pixel circuit for driving the organic EL element.
Figure 3:
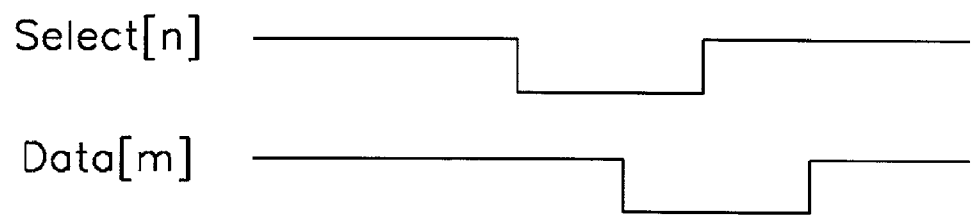
FIG. 3 shows a timing diagram of for the conventional pixel circuit.

The first and second signal lines 640 and 660 are connected to the first capacitor electrode 450 via a contact hole C3, and accordingly, as shown in FIG. 13, the drain electrode of the transistor M2 is connected to the gate electrodes of the transistors M2 and M1 and the source electrode of the transistor M4. The third signal line 670 is connected to a previous scan line Select[n-1] via the contact hole C3, and therefore, as shown by the equivalent circuit in FIG. 3, the drain electrode of the transistor M4 is connected to the previous scan line.

A passivation layer 700 of silicon oxide and silicon nitride is provided on the data wiring such as the data line 600 and the source and drain electrodes 610 and 620. A transparent pixel electrode 800 of indium-tin-oxide (ITO) is formed on the protective insulation layer 700 formed on the region IV. The pixel electrode 800 is connected to the drain electrode 620 of the TFT M1 through a hole C4 formed on the passivation layer 700.

A flattening layer 900 is formed on the protective insulation layer 700 and the pixel electrode 800, and an organic EL element layer 1000 is formed on the flattening layer 900 and the pixel electrode 800.

According to the OELD shown in FIG. 20, the TFTs M2 and M1 are provided on one line in parallel to the data line 600. In the case of manufacturing the OELD, laser beams are scanned in parallel to the data lines. Since the TFTs M2 and M1 are located on the line in parallel to the data line 600 according to the preferred embodiment of the present invention, they are scanned with the same laser beams. Hence, since the TFTs M1 and M2 are manufactured under almost the same process condition, their threshold voltages become almost identical.

Therefore, the preferred embodiment of the present invention satisfies the condition of $V_{TH1}=V_{TH2}$. Thus, Equation 3 is virtually satisfied and the OELD of high gray scale can be implemented.

The layout and the cross sectional view of the OELD shown in FIGS. 20 and 21 represents an exemplified embodiment, and diversified variations of embodiments can be implemented.

For example, in the case of manufacturing the OELD using scanned laser beams in parallel to the scan lines, the TFTs M2 and M1 may be located on the line in parallel to the scan line to be scanned with the same laser beams.

As described above, the present invention effectively compensates for the deviation of the threshold voltage of the TFT for driving the OELD and implements an OELD of higher gray scale.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. An organic electroluminescent display (OELD), comprising:
    a plurality of data lines for transmitting data voltages for representing image signals;
    a plurality of scan lines for transmitting select signals; and
    a plurality of pixel circuits respectively formed on a plurality of pixels defined by the data lines and the scan lines,
    wherein each of the pixel circuit comprises:
    an organic electroluminescent (EL) element for emitting light corresponding from a supplied current;
    a first switch for switching data voltage supplied to a data line in response to a select signal supplied to a scan line;
    a first thin film transistor (TFT) for supplying the current to the organic EL element in response to the data voltage supplied to a gate of the first TFT via the first switch;
    a second TFT having a gate coupled to the gate of the first TFT and compensating for a threshold voltage deviation of the first TFT;
    a capacitor for maintaining the data voltage supplied to the gate of the first TFT during a predetermined time; and
    a second switch for initializing the data voltage supplied to the gate of the first TFT in response to a control signal.

2. The OELD of claim 1, wherein the control signal is an additional external reset signal.

3. The OELD of claim 1, wherein the control signal is a select signal of a previous scan line.

4. The OELD of claim 3, wherein the data voltage is supplied to the data line before the select signal is supplied to the pixel.

5. The OELD of claim 1, wherein a gate and a drain of the second TFT are coupled together.

6. The OELD of claim 1, wherein the first switch is a third TFT having a gate coupled to the scan line, a source coupled to the data line, and a drain coupled to a source of the second TFT, and the second switch is a fourth TFT having a gate coupled to the control signal, a source coupled to the gate of the first TFT, and a drain to which a predetermined voltage for a resetting is supplied.

7. The OELD of claim 6, wherein the predetermined voltage supplied to the drain of the fourth TFT is a ground voltage.

8. The OELD of claim 6, wherein the predetermined voltage supplied to the drain of the fourth TFT is a pre-charge voltage.

9. The OELD of claim 8, wherein the pre-charge voltage is set to be less than the minimum data voltage supplied to the gate of the first TFT so as to represent the maximum gray level.

10. The OELD of claim 6, wherein the gate and the drain of the fourth TFT are coupled together.

11. The OELD of claim 6, wherein the first TFT, the second TFT, the third TFT and the fourth TFT have an identical conductive type.

12. The OELD of claim 6, wherein the first TFT, the second TFT and the third TFT are first conductive type transistors, and the fourth TFT is a second conductive type transistor which has a polarity opposite to that of the first conductive type transistors.

13. The OELD of claim 6, wherein the first TFT and the second TFT are first conductive type transistors, and the third TFT and the fourth TFT are second conductive type transistors which have polarity opposite to that of the first conductive type transistors.

14. The OELD of claim 1, wherein the first TFT and the second TFT have almost identical threshold voltages.

15. The OELD of claim 14, wherein the first TFT and the second TFT are parallel to the data line or the scan line, and formed on a same line.

16. A method for driving an organic electroluminescent display (OELD) including a plurality of data lines, a plurality of scan lines crossing the data lines, and plurality of matrix type pixels having thin film transistors (TFTs) formed in regions defined by the data lines and the scan lines and supplying current to organic electroluminescent (EL) elements, comprising:
  supplying a data voltage for representing image signals to the data lines;
  sequentially supplying a select signal for selecting a pixel row to the scan lines;
  switching the data voltage supplied to the data lines in response to the select signal, by a first switch;
  initializing the data voltage supplied to the gate of a current driving TFT in response to a control signal by a second switch;
  compensating the supplied data voltage to reduce a threshold voltage deviation of the current driving TFT; and
  transmitting the compensated data voltage to a gate of the current driving TFT, and supplying the current to the organic EL element.

17. The method of claim 16, wherein the control signal is an additional external reset signal.

18. The method of claim 16, wherein the control signal is a select signal of a previous scan line.

19. The method of claim 18, wherein the data voltage is supplied to the data line before the select signal is supplied to the scan line.

20. An organic electroluminescent display (OELD) pixel circuit formed on a plurality of pixels defined by a plurality of data lines and scan lines, comprising:
  an organic electroluminescent (EL) element;
  a first thin film transistor (TFT) having a drain coupled to the organic EL element;
  a second TFT having a gate coupled to a gate of the first TFT, and the gate and a drain of the second TFT being coupled together;
  a first switch having a control terminal coupled to the scan line, and having a first terminal and a second terminal respectively coupled to the data line and a source of the second TFT;
  a capacitor coupled between the gate and a source of the first TFT; and
  a second switch having a control terminal to which a control signal is supplied, a first terminal coupled to the drain of the second TFT, and a second terminal to which a predetermined voltage is supplied.

21. The pixel circuit of claim 20, wherein an additional external reset signal is supplied to the control terminal of the second switch.

22. The pixel circuit of claim 20, wherein a previous scan line is coupled to the control terminal of the second switch.

23. The pixel circuit of claim 20, wherein the first switch is a third TFT having a gate coupled to the scan line, a source coupled to the data line, and a drain coupled to a source of the second TFT, and the second switch is a fourth TFT having a gate for responding to the control signal, a source coupled to the gate of the first TFT, and a drain to which a predetermined voltage for a reset process is supplied.

24. The pixel circuit of claim 23, wherein the gate and the drain of the fourth TFT are coupled together.

25. The pixel circuit of claim 23, wherein the first to fourth TFTs have an identical conductive type.

26. The pixel circuit of claim 23, wherein the first TFT, the second TFT and the third TFT are first conductive type transistors, and the fourth TFT is a second conductive type transistor which has a polarity opposite to that of the first conductive type transistors.

27. The pixel circuit of claim 23, wherein the first TFT and the second TFT are first conductive type transistors, and the third TFT and the fourth TFT are second conductive type transistors which have polarity opposite to that of the first conductive type transistors.

28. The pixel circuit of claim 20, wherein the first TFT and the second TFT have almost identical threshold voltages.

29. The OELD of claim 2, wherein the first TFT and the second TFT are parallel to the data line or the scan line, and formed on the same line.

30. The OELD of claim 1, wherein the first switch is a third TFT having a gate coupled to the scan line, a drain coupled to the data line, and a source coupled to a drain of the second TFT, and the second switch is a fourth TFT having a gate coupled to the control signal, a drain coupled to the gate of the first TFT, and a source to which a predetermined voltage for a resetting is supplied.

31. The pixel circuit of claim 20, wherein the first switch is a third TFT having a gate coupled to the scan line, a drain coupled to the data line, and a source coupled to a drain of the second TFT, and the second switch is a fourth TFT having a gate for responding to the control signal, a drain coupled to the gate of the first TFT, and a source to which a predetermined voltage for a reset process is supplied.

* * * * *